(12) United States Patent
Choi

(10) Patent No.: US 7,794,920 B2
(45) Date of Patent: Sep. 14, 2010

(54) PATTERN DECOMPOSITION METHOD FOR DOUBLE EXPOSURE

(75) Inventor: Jae Seung Choi, Icheon-shi (KR)

(73) Assignee: Hynix Semiconductor Inc. (KR)

( * ) Notice: Subject to any disclaimer, the term of this patent is extended or adjusted under 35 U.S.C. 154(b) by 613 days.

(21) Appl. No.: 11/754,811

(22) Filed: May 29, 2007

(65) Prior Publication Data

US 2008/0020326 A1    Jan. 24, 2008

(30) Foreign Application Priority Data

Jul. 21, 2006    (KR) .................. 10-2006-0068524

(51) Int. Cl.
G03F 7/20    (2006.01)
(52) U.S. Cl. .............. 430/311; 430/394; 430/396
(58) Field of Classification Search .......... 430/311, 430/5, 394, 396
See application file for complete search history.

(56) References Cited

U.S. PATENT DOCUMENTS

| | | | |
|---|---|---|---|
| 6,451,508 B1 | 9/2002 | Bukofsky et al. | 430/311 |
| 6,511,791 B1 | 1/2003 | Bukofsky et al. | 430/311 |
| 7,028,284 B2 | 4/2006 | Cobb et al. | |
| 7,165,234 B2 | 1/2007 | Pierrat | |
| 2005/0081178 A1 | 4/2005 | Sivakumar et al. | 716/19 |
| 2005/0164129 A1 | 7/2005 | Minami | 430/311 |

FOREIGN PATENT DOCUMENTS

| | | |
|---|---|---|
| CN | 1688934 | 10/2005 |
| JP | 2000-349010 | 12/2000 |
| JP | 2003-282419 | 10/2003 |
| KR | 10-2002-0056385 | 7/2002 |
| KR | 10-0721205 | 5/2007 |

*Primary Examiner*—Kathleen Duda
(74) *Attorney, Agent, or Firm*—Marshall, Gerstein & Borun LLP

(57) ABSTRACT

A pattern decomposition method capable of achieving patterns with a complicated layout by double exposure. The pattern decomposition method for decomposing a target pattern which includes first patterns having repeated lines and spaces and second patterns disposed between the first patterns and having a predetermined size into patterns for first exposure and patterns for second exposure, comprises decomposing the first patterns into a pattern for first exposure and a pattern for second exposure, decomposing the second patterns into a pattern for first exposure and a pattern for second exposure, and respectively merging the pattern for first exposure or the pattern for second exposure of the first patterns with the pattern for first exposure or the pattern for second exposure of the second patterns.

7 Claims, 4 Drawing Sheets

PATTERN DECOMPOSITION METHOD FOR DOUBLE EXPOSURE

CROSS-REFERENCE TO RELATED APPLICATION

The present application claims priority to Korean patent application number 10-2006-0068524, fired on Jul. 21, 2006, which is incorporated by reference in its entirety.

BACKGROUND OF THE INVENTION

1. Field of the Invention

The invention relates to a pattern forming method of a semiconductor device, and more particularly to a pattern decomposition method which is capable of achieving complicated layout patterns, which are conventionally achieved by a triple-exposure method, by double exposure.

2. Description of Related Technology

As one of the methods for increasing a resolution with the same wavelength as a numerical aperture (NA) of an exposure system, a double-exposure technique has been developed. A double-exposure technique involves decomposing complicated patterns so as to firstly expose one pattern and secondarily expose the other pattern. Such a semiconductor manufacturing method using double exposure commonly includes two mask processes and two etching processes. In other words, the desired patterns are completely formed in such a manner that the first mask and etching processes are performed and then the second mask and etching processes are performed.

One of the most important factors of the double-exposure technique is to perform the decomposition of a target pattern adequately for the double exposure, i.e., so as not to expose the adjacent patterns at the same time. It is easy to decompose patterns including simple lines and spaces. But when the target pattern includes a complicated layout, the patterns can not be adequately decomposed by double exposure, i.e., it is virtually impossible to practically achieve the independent pattern or the short patterns on the wafer. To this end, patterns having complicated layouts are often decomposed into three groups of patterns so as to apply a triple-exposure method (not the double-exposure method).

As described above, double-exposure methods cannot achieve complicated layout patterns on the wafer. However, when triple-exposure methods are used, one more mask should be fabricated and many processes, such as an exposure process, an etching process, a cleaning process, a deposition process, and the like, should be added. Accordingly, manufacturing costs and turn around times increase.

BRIEF SUMMARY OF THE INVENTION

The invention has been made to solve the foregoing problems of the prior art, and it is an aspect of the invention to provide a pattern decomposition method capable of achieving patterns with a complicated layout by double exposure.

Consistent with one aspect, an exemplary embodiment of the invention provides a double exposure pattern decomposition method for decomposing a target pattern which includes first patterns having repeated lines and spaces and second patterns disposed between the first patterns and having a predetermined size into patterns for first exposure and patterns for second exposure, comprising: a) decomposing the first patterns into a pattern for first exposure and a pattern for second exposure; b) decomposing the second patterns into a pattern for first exposure and a pattern for second exposure; and c) respectively merging the pattern for first exposure or the pattern for second exposure of the first patterns with the pattern for first exposure or the pattern for second exposure of the second patterns.

The decomposing step a) includes: decomposing the first patterns into the pattern for first exposure and the pattern for second exposure in view of a wavelength of a light source used for exposure and a numerical aperture of an exposure system.

In another aspect, the decomposing step a) includes: decomposing the first patterns into the pattern for first exposure and the pattern for second exposure such that a pitch between the pattern for first exposure and the pattern for second exposure is larger than a minimum pitch which can be achieved on a substrate with exposure conditions of a wavelength of a light source used for exposure and a numerical aperture of an exposure system.

The decomposing step b) includes: decomposing the second patterns into the pattern for first exposure and the pattern for second exposure in view of a wavelength of a light source used for exposure and a numerical aperture of an exposure system.

The merging step c) includes: merging the pattern for first exposure of the first patterns with the pattern for first exposure of the second patterns; and merging the pattern for second exposure of the first patterns with the pattern for second exposure of the second patterns.

Alternatively, the merging step c) may include: merging the pattern for first exposure of the first patterns with the pattern for second exposure of the second patterns; and merging the pattern for second exposure of the first patterns with the pattern for first exposure of the second patterns.

BRIEF DESCRIPTION OF THE DRAWINGS

The above and other objects features and other advantages of the invention will be more clearly understood from the following detailed description taken in conjunction with the accompanying drawings, in which.

DETAILED DESCRIPTION OF THE INVENTION

Preferred embodiments of the invention will now be described in detail with reference to the accompanying drawings.

The invention provides a pattern decomposition method capable of achieving patterns with complicated layouts by double exposure.

In an exposure technique for manufacturing a semiconductor device, a "resolution" refers to the capability of an optical system (e.g., a microscope, a telescope, a camera lens, etc.) to distinguish, detect, and/or record details, or the capability of a spectroscope or a mass spectrometer to discern small objects.

The resolution of the exposure system can be determined from the following equation 1 ("the Rayleigh equation").

$$R = k_1 \times \lambda / NA \qquad \text{Eq. 1}$$

Here, R refers to a resolution, $K_1$ refers to a process constant, $\lambda$ refers to a wavelength of a light source, and NA refers to a numerical aperture.

Accordingly, in order to achieve the smaller patterns, i.e., in order to increase the resolution (R), it is necessary to use a light source having a shorter wavelength ($\lambda$) or to use a larger numerical aperture (NA). However, because there are limitations in both using light having a short wavelength and in using a large numerical aperture, many exposure techniques for achieving smaller patterns using the same wavelength and the same numerical aperture have been developed.

In the double-exposure technique of one of the developed exposure techniques, the most important factor is to apply a proper optical proximity correction (OPC) technique so as to decompose the desired target pattern adequately for double exposure and achieve the respective decomposed patterns on the wafer (as they are on the target pattern).

Conditions to be considered in the pattern decomposition process are that the patterns after the pattern decomposition always have a pitch larger than the minimum pitch acquired from the wavelength of the light source and the numerical aperture (NA) of the exposure system Additionally, achieving the decomposed patterns on the substrate through the OPC operation should be possible. When the pattern decomposition process can be performed in view of the layout but the decomposed patterns cam-lot be achieved on the substrate through the OPC operation, for example, such as when the respective patterns after the pattern decomposition have smaller areas or the layout includes line ends, it is impossible to apply the double-exposure technique.

The invention can solve the problems of conventional triple exposure by achieving the patterns with a complicated layout, which were achieved by the conventional triple-exposure method, by double exposure while satisfying the above-described conditions to be considered in the pattern decomposition process.

Figure 1:
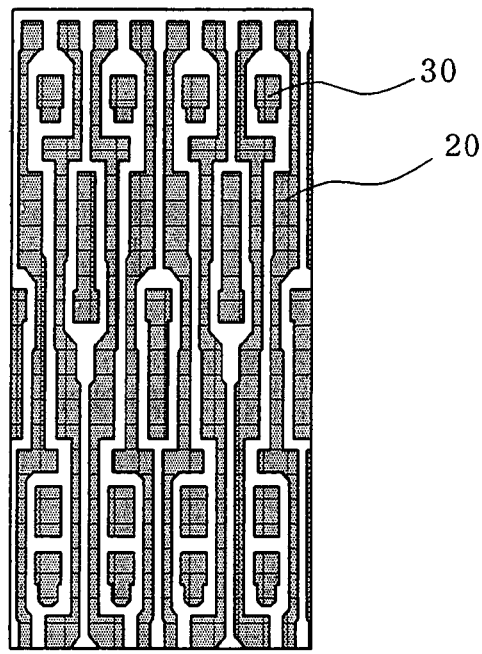
FIG. 1 is a view illustrating a target pattern with complicated layout.

FIG. 1 shows the target pattern with a complicated layout.

As shown in the drawing, the target pattern has a complicated layout, i.e., line/space patterns 20 and other patterns 30 disposed between the line/space patterns 20. The line/space patterns 20 may become patterns for forming metal wire lines in the semiconductor device, and the other patterns 30 may become patterns for forming contact pads.

Figure 2:
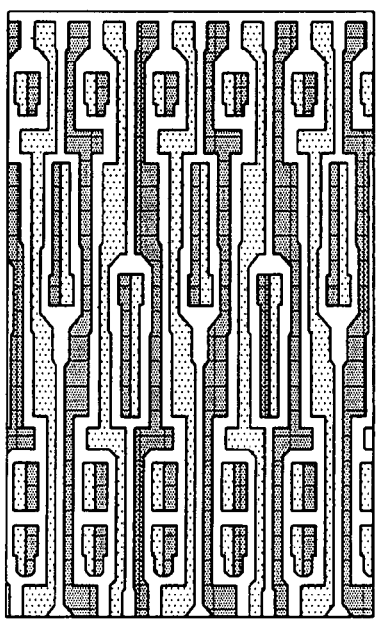
FIG. 2 is a view of decomposing a target pattern depicted in FIG. 1 according to a pattern decomposition method of the invention.

FIG. 2 is a view of decomposing the target pattern depicted in FIG. 1 according to the pattern decomposition method of the invention. And, FIGS. 3A to 3F are views illustrating the patterns in respective stages according to the pattern decomposition method of the invention.

Figure 3A:
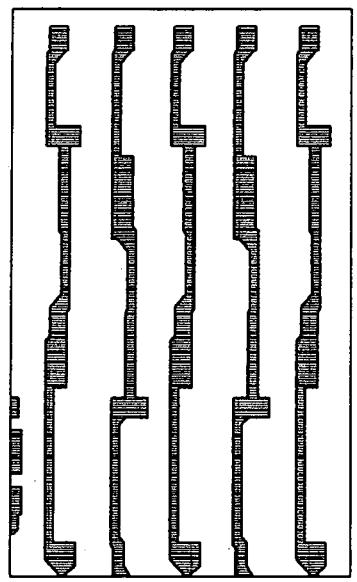
FIGS. 3A to 3F are views illustrating patterns in respective stages according to a pattern decomposition method of the invention.
Figure 3B:
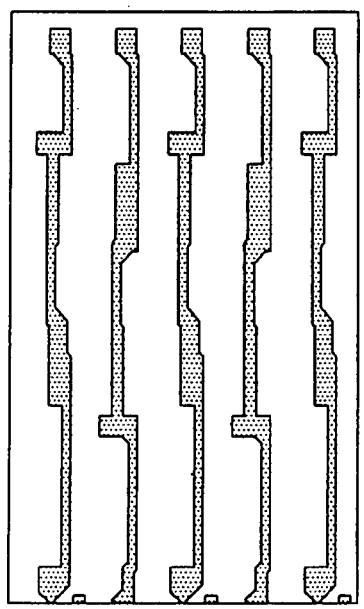

First, referring to FIGS. 3A and 3B, small patterns having the minimum pitch are separated from the target pattern, and an arbitrary small pattern is selected from the separated patterns. The small patterns which are spaced apart from the selected small pattern at a predetermined gap are selected and extracted as patterns for the first exposure. The patterns extracted for the first exposure approximate the line/space patterns. At this time, the patterns are extracted so as to have a proper pitch in consideration of the pitch which can be achieved on the substrate from the wavelength of the light source and the numerical aperture (NA) of the exposure system. And, the remaining small patterns are extracted as patterns for the second exposure.

Figure 3C:
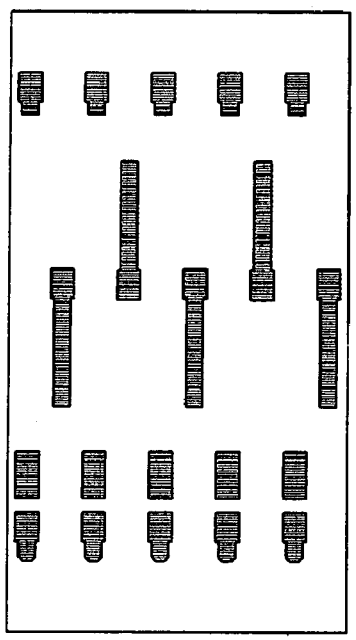

Referring to FIG. 3C, the residual patterns except the extracted patterns for the first and second exposure of the target pattern, i.e., the patterns for forming the contact pads, are extracted. At this time, the residual patterns should have a larger size double or more than the minimum size of the patterns for the first exposure or the patterns for the second exposure so that the residual patterns can be decomposed into two groups of patterns.

Figure 3D:
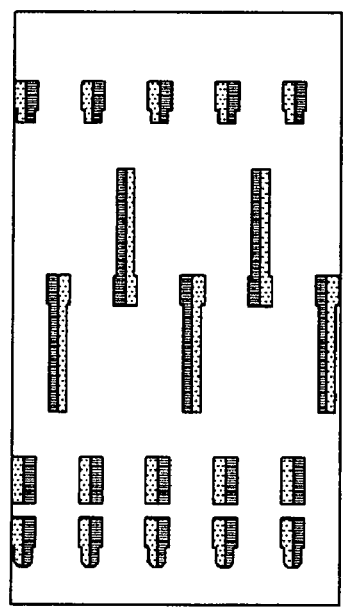

Referring to FIG. 3D, the extracted residual patterns are decomposed into patterns for the first exposure and patterns for the second exposure. At this time, the residual patterns should be decomposed so as to have a pitch larger than the minimum pitch acquired from the wavelength of the light source used in the exposure process and the numerical aperture (NA) of the exposure system.

Figure 3E:
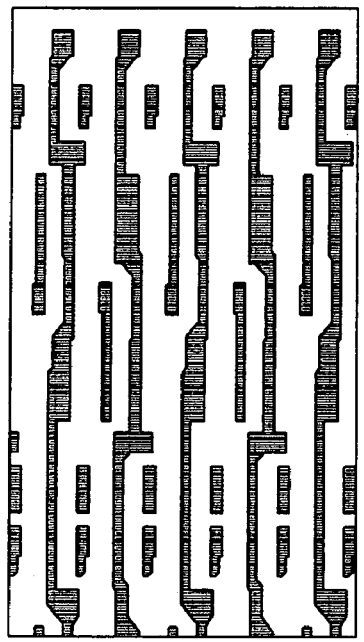

Referring to FIG. 3E, the patterns extracted for the first exposure (refer to FIG. 3A) are merged with the patterns extracted for the first or second exposure (refer to FIG. 3D).

Figure 3F:
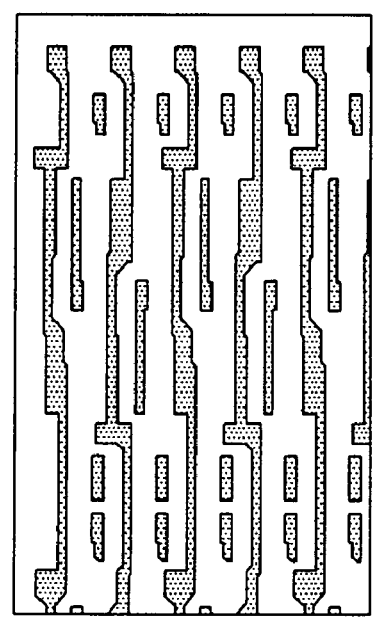

Thereafter, referring to FIG. 3F, the patterns extracted for the second exposure (refer to FIG. 3B) are merged with the patterns extracted for the first or second exposure (refer to FIG. 3D).

As described above, the invention performs the pattern decomposition from the point of view that the patterns used in the semiconductor manufacturing, process have different sizes. In other words, the patterns used in the semiconductor manufacturing process are regularly repeated, and include the patterns for forming the wire lines having a relatively small size and the patterns for forming the contact pads having a size larger than contact holes. Accordingly, the patterns for the first and second exposure are configured as the wire line patterns having a small size, and the contact pad patterns having a relatively large size are decomposed into two groups of patterns to be exposed together with the wire line patterns having a small size.

Through the above process, the patterns, which were achieved by the conventional triple-exposure method, can be achieved by double exposure. Describing in detail, the target pattern with the complicated layout is decomposed into three groups of patterns for triple exposure. The patterns having the smallest size are extracted as patterns for double exposure from three decomposed groups of patterns and the residual patterns are decomposed in consideration of the pitch with two already-decomposed groups of patterns. The respective decomposed residual patterns are merged with the already-decomposed patterns, so that the patterns can be achieved only by two exposures. At this time, because the residual patterns are decomposed into two groups of patterns in the pattern decomposition for double exposure, the patterns having the largest size of three groups of patterns are selected as the residual patterns.

As apparent from the above description, according to the pattern decomposition method for double exposure of the invention, the number of masks necessary to conduct the pattern decomposition is reduced, and one or more exposure processes, etching processes, cleaning processes, and deposition processes are eliminated. Accordingly, manufacturing costs and turn around times are advantageously decreased.

The embodiments of the invention have been disclosed above for illustrative purposes. Those skilled in the art will appreciate that various modifications, additions and substitutions are possible, without departing from the scope and spirit of the invention as set forth in the accompanying claims.

What is claimed is:

1. A double exposure pattern decomposition method for decomposing a target pattern which includes first patterns having repeated lines and spaces and second patterns disposed between the first patterns and having a predetermined size into patterns for first exposure and patterns for second exposure, the method comprising:

a) decomposing the first patterns into a pattern for first exposure and a pattern for second exposure;

b) decomposing the second patterns into a pattern for first exposure and a pattern for second exposure; and c) respectively merging the pattern for first exposure or the pattern for second exposure of the first patterns with the pattern for first exposure or the pattern for second exposure of the second patterns.

2. The pattern decomposition method according to claim 1, comprising decomposing the first patterns into the pattern for first exposure and the pattern for second exposure in view of a wavelength of a light source used for exposure and a numerical aperture of an exposure system.

3. The pattern decomposition method according to claim 1, comprising decomposing the first patterns into the pattern for first exposure and the pattern for second exposure such that a pitch between the pattern for first exposure and the pattern for second exposure is larger than a minimum pitch which can be achieved on a substrate with exposure conditions of a wavelength of a light source used for exposure and a numerical aperture of an exposure system.

4. The pattern decomposition method according to claim 1, wherein the second patterns are sized such that two decomposed groups of patterns of the second patterns can be achieved on a substrate.

5. The pattern decomposition method according to claim 1, comprising decomposing the second patterns into the pattern for first exposure and the pattern for second exposure in consideration of a wavelength of a light source used for exposure and a numerical aperture of an exposure system.

6. The pattern decomposition method according to claim 1, comprising merging the pattern for first exposure of the first patterns with the pattern for first exposure of the second patterns; and merging the pattern for second exposure of the first patterns with the pattern for second exposure of the second patterns.

7. The pattern decomposition method according to claim 1, comprising merging the pattern for first exposure of the first patterns with the pattern for second exposure of the second patterns; and merging the pattern for second exposure of the first patterns with the pattern for first exposure of the second patterns.

* * * * *